United States Patent

Iwasa

[15] 3,646,411

[45] Feb. 29, 1972

[54] SURFACE BARRIER JUNCTION DIODE

[72] Inventor: Minetaka Iwasa, Tokyo, Japan

[73] Assignee: Nippon Electric Company, Ltd., Tokyo, Japan

[22] Filed: Dec. 16, 1969

[21] Appl. No.: 885,584

[30] Foreign Application Priority Data

Dec. 20, 1968 Japan....................................43/94071

[52] U.S. Cl...............317/235 UA, 317/235 UA, 317/235 T, 317/235 AL, 317/235 AM

[51] Int. Cl...........................................................H01l 3/00

[58] Field of Search..................................................317/235

[56] References Cited

UNITED STATES PATENTS 3,457,469 7/1969 Lawrence..............................317/234
3,540,010 11/1970 Heightley et al.........................340/173
3,513,366 5/1970 Clark.......................................317/235
3,394,289 7/1968 Lindmayer...............................317/235

FOREIGN PATENTS OR APPLICATIONS 1,293,902 5/1964 Germany...............................317/235

*Primary Examiner*—John W. Huckert
*Assistant Examiner*—E. Wojciechowicz
*Attorney*—Sandoe, Hopgood and Calimafde

[57] ABSTRACT

A surface barrier junction diode is disclosed in which the impurity concentration of the epitaxial layer immediately beneath the Schottky barrier is higher than that of the other regions of the epitaxial layer. The diode has improved voltage-current characteristics in both the reverse and forward directions.

2 Claims, 24 Drawing Figures

*INVENTOR*
Minetaka Iwase

*by*
Sandoe, Hopgood & Calimafde
ATTORNEYS

*INVENTOR*
Minetaka Iwase by
Sandoe, Hopgood & Calimafde
ATTORNEYS

SURFACE BARRIER JUNCTION DIODE

This invention relates generally to surface barrier junction diodes, and particularly to the so-called Schottky diode.

The Schottky diode utilizes the Schottky barrier formed by a surface contact between a metal and a semiconductor. In the Schottky diode, when a forward bias voltage is applied to the diode, the minority carriers are not injected and an electric current is caused to flow by the majority carriers only. Therefore, the diode is inherently adapted to high-speed switching and high-frequency operation.

A conventional Schottky diode comprises, as shown in FIG. 1, an N-type substrate 1, an epitaxial layer 2 having a high specific resistance grown on substrate 1, an oxide film 3 formed partially on epitaxial layer 2, and an electrode 4 evaporated on epitaxial layer 2. The Schottky barrier is formed between epitaxial layer 2 and the electrode 4, and exhibits a rectifying operation.

In this diode, the reverse current is relatively high, that is, the rectifying characteristic of the diode is not satisfactory. It is believed that this disadvantageous characteristic is attributed to the fact that a flat space-charge region B is produced directly below metal layer 4 and the electric field is concentrated at the end portions A and C in epitaxial layer 2. When the impurity concentration of epitaxial layer 2 is high, the current vs. voltage (V-I) characteristic of the diode is satisfactory in the forward direction but unsatisfactory in the reverse direction as shown by the solid-line curve (a) in FIG. 3. Conversely, when the impurity concentration is low, the current vs. voltage (V-I) characteristic of the diode is unsatisfactory in the forward direction but satisfactory in the reverse direction as represented by the broken-line curve (b) in FIG. 3.

It is, therefore, an object of this invention to provide an improved surface barrier junction diode which has the voltage-current (V-I) characteristic shown by curve (b) of FIG. 3 in the reverse direction, and curve (a) of FIG. 3 in the forward direction, and in which the electrostatic capacity of the barrier is always maintained at a low value.

According to this invention, there is provided an improved surface barrier junction diode in which the impurity concentration of the epitaxial layer immediately beneath the junction between the metal and semiconductor is higher than that of the other parts of the epitaxial layer.

To the accomplishment of the above and to such other objects as may hereinafter appear, the present invention relates to a surface barrier junction diode as defined in the appended claims and as described in the following specification taken together with the accompanying drawings in which:

Figure 1:
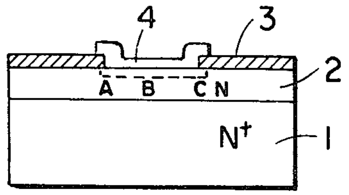
(Prior Art) FIG. 1
FIG. 1 is a sectional view of a conventional surface barrier junction diode.
Figure 2:
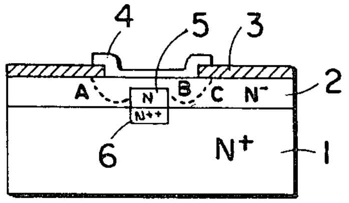
FIG. 2 is a sectional view of a surface barrier junction diode according to an embodiment of this invention.
Figure 3:
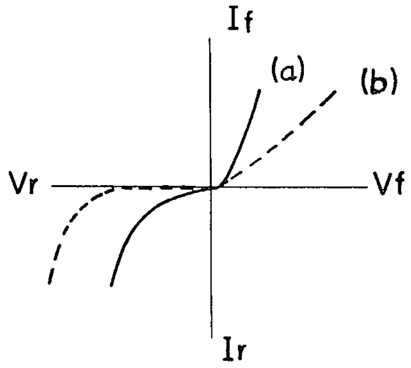
FIG. 3 is a graphical representation of the current vs. voltage characteristic of the conventional surface barrier junction diode.

Referring to FIG. 2, a surface barrier junction diode according to this invention comprises an N-type substrate 1, an epitaxial layer 2, an oxide film 3, a metal layer 4, a first N-type layer 5 formed in epitaxial layer 2 having a lower impurity concentration than the N-type substrate 1 denoted by $N^+$, and a second N-type layer 6 formed in substrate 1 denoted by $N^{++}$ having a higher impurity concentration than the N-type substrate 1. The impurity concentration of the epitaxial layer 2 denoted by $N^-$ is the lowest of the four N-type layers 1, 2, 5 and 6. As a result of this structure of the diode of the invention, the spreading resistance directly beneath metal layer 4 is low, the impurity concentration of epitaxial layer 2 near the barrier is low, and the space-charge region is represented by the broken line B. Therefore, the diode of FIG. 2 has an improved voltage-current characteristic which is represented by the curve (a) in the forward direction and by the curve (b) in the reverse direction.

Several methods of making surface barrier diodes of this invention are explained with reference to FIGS. 4–6.

Figure 4:
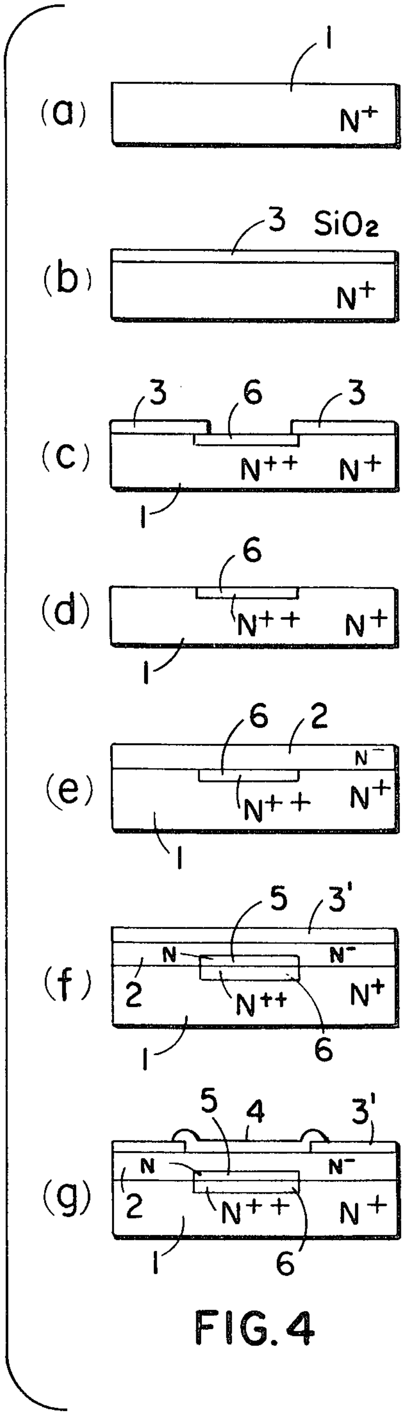
FIGS. 4, 5 and 6 illustrate steps in the process of manufacturing the surface barrier junction diode of this invention.
Figure 5:
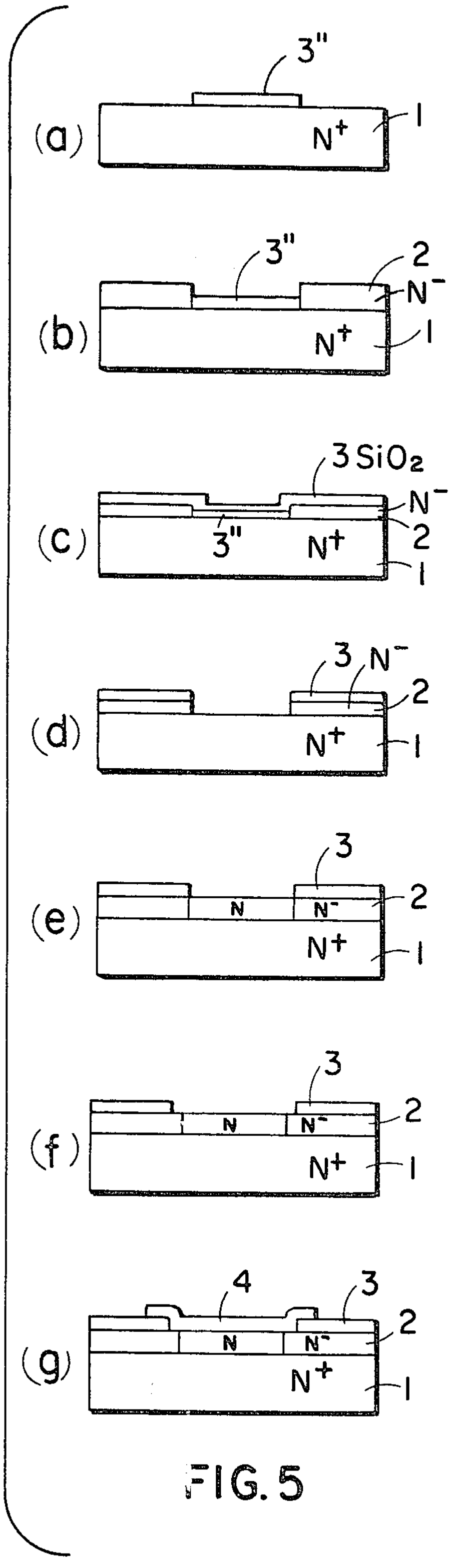

Referring to FIG. 4, the N-type silicon substrate 1 containing an impurity of a low diffusion coefficient, for example, antimony having an impurity concentration of $5\times10^{18}/cm.^3$ (shown in FIG. 4(a)), is steamed at a temperature of approximately 1,000° C. for about 3 hours so as to form the oxide film 3, as shown in FIG. 4 (b). Next, as shown in FIG. 4 (c), the oxide film 3 is selectively etched by a photo-etching technique, and phosphorus is diffused into the N-type substrate 1 to form a phosphorus-diffused layer 6 having a surface impurity concentration of approximately $10^{20}/cm^3$. The remainder of oxide film 3 is removed by immersing the device in fluoric acid (FIG. 4 (d)). Silicon chloride Si $Cl_4$ is decomposed in a hydrogen atmosphere to form an N-type epitaxial layer 2 having a high specific resistance (with an impurity concentration of approximately $5\times10^{15}/cm.^3$) as shown in FIG. 4 (e). By heating the device thus obtained in an oxidizing atmosphere at a temperature of between 1,100° and 1,200° C., the oxide film 3′ is formed on the surface and, at the same time, the impurity 6 selectively diffused in N-type substrate 1 is diffused into epitaxial layer 2 to form an N-type layer 5 as shown in FIG. 4 (f). It is obvious that the selective diffusion is possible in this step when the temperature for the epitaxial growth is sufficiently high. The oxide film 3′ covering the epitaxial layer 2 and overlying the selectively diffused layer 5 is selectively removed, and metal 4 such as molybdenum or palladium, is vacuum evaporated on the oxide-film-removed part, to form with the epitaxial layer the surface barrier. The surface barrier function diode of the invention is thus obtained.

FIGS. 5*a–g* illustrate the steps of manufacturing a surface barrier diode according to a second embodiment of the invention. An oxide film 3″ is selectively etched on an N-type substrate 1 as shown in FIG. 5 (a). An epitaxial layer 2 having a high specific resistance (or a low impurity concentration) is formed on those portions of N-type substrate 1 which are not covered by the oxide film 3″ as shown in FIG. 5 (b). As shown in FIG. 5 (c), an oxide film 3 is formed on the epitaxial layer 2 and the oxide film 3″, and oxide films 3 and 3″ are selectively etched away as shown in FIG. 5 (d). As shown in FIG. 5 (e), an N-type layer denoted by N having an impurity concentration lower than N-type substrate 1 but higher than epitaxial layer 2, is formed on substrate 1 such as by a selective epitaxial growth technique. The oxide film 3 is further selectively etched so as to produce the device shown in FIG. 5 (f). Finally, metal 4, such as molybdenum, is evaporated on the N-type layer and a portion of the epitaxial layer 2 to produce the surface barrier junction diode shown in FIG. 5 (g).

Figure 6:
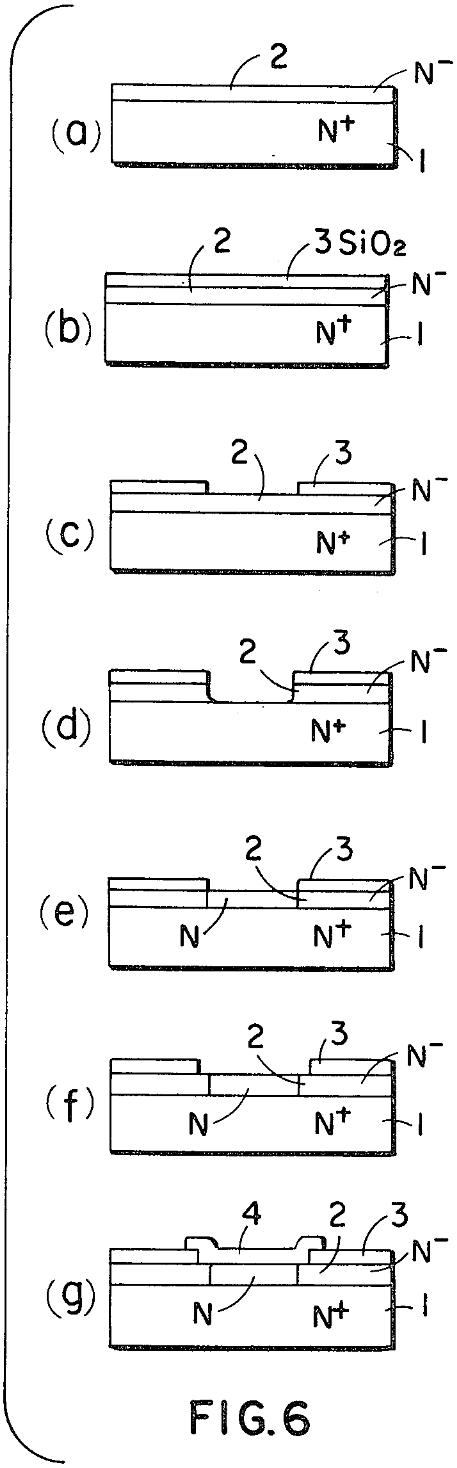

FIGS. 6 *a–g* illustrate the steps of making a diode according to still another embodiment of this invention. An epitaxial layer 2 is initially formed on the N-type substrate 1 as shown in FIG. 6 (a), and an oxide film 3 is then formed on the epitaxial layer 2 (FIG. 6 (b)). The oxide film 3 is selectively etched away as shown in FIG. 6 (c), and epitaxial layer 2 is also selectively etched away as shown in FIG. 6 (d). An N-type layer is formed on those portions of N-type substrate 1 which are not covered with the epitaxial layer 2 and the oxide film 3 as shown in FIG. 6 (e). The oxide film 3 is further selectively etched so as to produce the device shown in FIG. 6 (f), and finally, metal 4 is evaporated on the N-type layer and a portion of the epitaxial layer 2 to produce a surface barrier junction diode as shown in FIG. 6 (g).

While several embodiments of the invention have been herein specifically disclosed, it will be apparent that many variations may be made therein without departing from the spirit and scope of the invention.

I claim:

1. A surface barrier junction diode comprising a semiconductor substrate of a predetermined conductivity type, an epitaxial layer of the same conductivity type grown on said semiconductor substrate, and a metal film formed on said epitaxial layer forming a Schottky barrier with said epitaxial layer, said epitaxial layer including a region of the same conductivity type beneath said metal film and having a higher impurity concentration than that of the other portions of said epitaxial layer and a lower impurity concentration than that of said substrate, the peripheral portion of said metal film extending beyond said region and overlying the lower impurity concentration portions of said epitaxial layer surrounding said region.

2. The surface barrier junction diode of claim 1, further comprising a region in said substrate in contact with said region in said epitaxial layer beneath said metal film and having a higher impurity concentration than said epitaxial layer region and the remainder of said substrate.

* * * * *